United States Patent [19]
Ohsawa et al.

[11] Patent Number: 5,901,436
[45] Date of Patent: May 11, 1999

[54] METHOD OF MANUFACTURING LEAD FRAME

[75] Inventors: Kenji Ohsawa; Makoto Ito, both of Kanagawa, Japan

[73] Assignee: Sony Corporation, Tokyo, Japan

[21] Appl. No.: 08/730,782

[22] Filed: Oct. 16, 1996

[51] Int. Cl.$^6$ .................................................. H01R 43/00
[52] U.S. Cl. ............................................. 29/827; 216/14
[58] Field of Search ........................... 29/827, 848, 852; 216/14; 257/676; 361/813; 205/122, 123, 125

[56] References Cited

U.S. PATENT DOCUMENTS

| | | |
|---|---|---|
| 5,148,265 | 9/1992 | Khandros et al. . |
| 5,221,428 | 6/1993 | Ohsawa et al. . |
| 5,224,264 | 7/1993 | Takahashi et al. ........................ 29/827 |
| 5,258,330 | 11/1993 | Khandros et al. . |
| 5,349,238 | 9/1994 | Ohsawa et al. . |
| 5,361,491 | 11/1994 | Oomachi et al. ......................... 29/852 |
| 5,378,581 | 1/1995 | Vernon ................................. 29/827 X |
| 5,426,850 | 6/1995 | Fukutomi et al. ........................ 29/848 |
| 5,474,957 | 12/1995 | Urushima ................................ 29/827 |
| 5,481,798 | 1/1996 | Ohsawa et al. ......................... 29/827 |
| 5,656,550 | 8/1997 | Tsuji et al. ............................ 29/827 X |
| 5,679,194 | 10/1997 | Fjelstad et al. ....................... 29/827 X |
| 5,683,942 | 11/1997 | Kata et al. ............................ 29/827 X |

OTHER PUBLICATIONS

K. Ohsawa et al. Report entitled: "Research on Ultra–Fine Pitch Leadframe Manufacturing Process (UFPL)", *The Second VLSI Packaging Workshop, Nov. 30–Dec. 2, 1994*, pages 71–72.

Report entitled: "The New Process of Combined TAB Type L/F, New Technology Symposium of ULSI Package '95", pages 106–121.

*Primary Examiner*—Peter Vo
*Assistant Examiner*—Rick Kiltae Chang
*Attorney, Agent, or Firm*—Hill & Simpson

[57] ABSTRACT

Leads are formed on a surface of an etching stop film of a base, and holes are defined in the base and a region of a substrate which corresponds to a lead-forming region is thinned by selective etching on both upper and lower surfaces of the base. A lead holder film having a device hole and an outer lead bonding slit is applied to the upper surface of the base. The thinned region of the substrate is removed by selective etching on the lower surface of the base, and the etching stop film is etched away.

8 Claims, 2 Drawing Sheets

METHOD OF MANUFACTURING LEAD FRAME

BACKGROUND OF THE INVENTION

1. Field of the Invention

The present invention relates to a method of manufacturing a lead frame, and more particularly to a method of manufacturing a lead frame to produce leads in a fine pattern at a reduced cost while preventing the leads from being deformed in the fabrication process and allowing the leads to be plated with ease.

2. Description of the Related Art

As the degree of integration of semiconductor devices including ICs, LSI circuits, etc. increases and those semiconductor devices have a greater number of terminals, more and more lead frames manufactured by TAB (Tape-Automated Bonding) are replacing conventional lead frames of a metal sheet of copper or the like which is pressed or etched to form a plurality of integral leads, as providing electric leads of electrodes of the semiconductor devices.

TAB lead frames comprise a tape of a heat-resistant synthetic resin such as polyimide and a plurality of leads of copper or the like supported on the tape, as disclosed in Japanese laid-open patent publication No. 5-198618.

Heretofore, a TAB lead frame is manufactured as follows: A metal film of copper or the like is deposited on a flexible tape base of an insulating synthetic resin such as polyimide. Then, the metal film is selectively etched into a predetermined pattern of leads. The conventional manufacturing process has imposed a limitation on efforts to produce a fine pattern of leads because the metal film has a poor affinity for the tape base of an insulating synthetic resin. Therefore, it has been difficult to form a film, such as a copper film, of thin dense leads.

Furthermore, the width of leads cannot be reduced beyond a certain limit, and the leads are subject to a phenomenon known as side etching. Since the tape base is not right, but flexible, is managed and assembled tool to tool, and is difficult to handle as it tends to be easily curled, so that it is difficult to form leads on the tape base. These shortcomings have also been responsible for thwarting attempts to make finer lead patterns.

Since leads are formed on an insulating tape base and are insulated from each other thereby, if inner or outer leads are to be electroplated with metal for bonding, then it is necessary to provide a circuit for applying a potential to the leads only for electroplating the leads, and then remove the circuit after the leads are electroplated. Such a process is disadvantageous in that an extra space for providing the circuit therein is required, the process needs a large number of steps, and the resultant lead frame is highly costly.

The synthetic resin of the tape base or carrier for the leads is expensive, and is wasteful because it is mostly removed eventually. This has prevented the cost of the conventional lead frames from being lowered.

Tapes for use in TAB are manufactured by a tool-to-tool tape carrier system. Therefore, they can be mass-produced in few types. However, the TAB tapes do not lend themselves to a production scheme for producing many types in small quantities, which has recently been considered to be more important than before in the art. The sizes, particularly widths, of TAB tapes and circuit patterns thereon are limited by production equipment standards. Accordingly, the TAB tapes find it difficult to meet a variety of needs which will be growing in the art.

SUMMARY OF THE INVENTION

It is therefore an object of the present invention to provide a method of manufacturing a lead frame in a fine pattern while electroplating leads for inner lead bonding capability without the need for any special wiring or circuit, without causing a wasteful loss of an expensive synthetic resin material, and allowing a lead pattern to be designed in a manner free of limitations imposed by fabrication equipment standards.

According to the present invention, there is provided a method of manufacturing a lead frame, comprising the steps of providing a base metal having a first surface of an etching stop film and a second surface, the first surface having a lead-forming region, forming a plurality of leads in the lead-forming region of on the first surface, forming a first etching mask film in covering relation to the lead-forming region while exposing portions where holes are to be defined, and a second etching mask in covering relation to the second surface while exposing a region of the second surface corresponding to the lead-forming region and portions where holes are to be defined, etching the base metal through the first etching mask film and the second etching mask film to define the holes and to thin the region of the second surface corresponding to the lead-forming region, applying a lead holder film of an insulating material to the first surface while exposing inner leads of the leads, the lead holder film having a device hole and an outer lead bonding slit positioned outside of the device hole, and selectively removing the second surface and the etching stop film for making the leads held by the lead holder film electrically independent of each other.

According to the present invention, there is also provided a method of manufacturing a semiconductor package, comprising the steps of providing a base metal having a first surface of an etching stop film and a second surface, the first surface having a lead-forming region, forming a plurality of leads in the lead-forming region of on the first surface, forming a first etching mask film in covering relation to the lead-forming region while exposing portions where holes are to be defined, and a second etching mask in covering relation to the second surface while exposing a region of the second surface corresponding to the lead-forming region and portions where holes are to be defined, etching the base metal through the first etching mask film and the second etching mask film to define the holes and to thin the region of the second surface corresponding to the lead-forming region, applying a lead holder film of an insulating material to the first surface while exposing inner leads of the leads, the lead holder film having a device hole and an outer lead bonding slit positioned outside of the device hole, selectively removing the second surface and the etching stop film for making the leads held by the lead holder film electrically independent of each other, bonding the inner leads of the leads to electrodes on a semiconductor chip, encapsulating the bonded inner leads and a surface of the semiconductor chip which is bonded thereto with a resin material, bonding outer leads of the leads to a wiring pattern on a printed wiring board, removing outer portions of the bonded outer leads, and removing the etching stop film.

DETAILED DESCRIPTION OF THE PREFERRED EMBODIMENT

Successive steps (A) through (F) of a method of manufacturing a lead frame according to the present invention will be described below with reference to FIGS. 1(A) through 1(F).

Figure 1A:
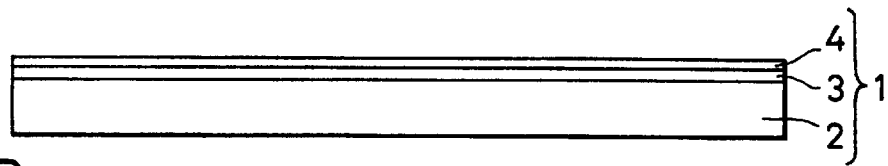
FIGS. 1(A) through 1(F) are cross-sectional views showing successive steps of a method of manufacturing a lead frame according to the present invention.

(A) As shown in FIG. 1(A), a base 1 of a three-layer structure is prepared. Specifically, the base 1 comprises a substrate 2 made of copper, for example, and having a thickness of 150 μm, for example, an etching stop film 3 made of aluminum, for example, and having a thickness of 3 μm, for example, the etching stop film 3 being deposited on an upper surface of the substrate 2, and a plating base film 4 made of copper, for example, and having a thickness of about 2 μm, for example, the plating base film 4 being deposited on an upper surface of the etching stop film 3.

The substrate 2 will mostly be removed eventually, but will be necessary transiently as a base for forming very thin leads thereon and thereafter as a frame.

Figure 1B:
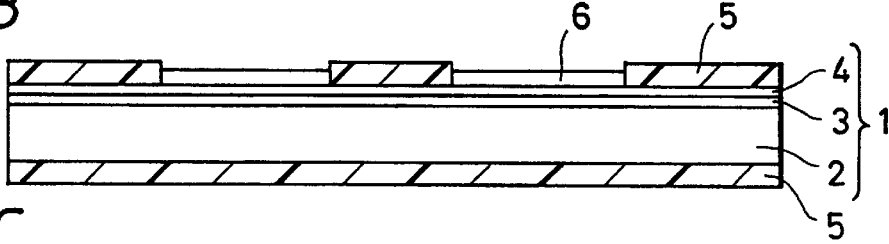

(B) Then, as shown in FIG. 1(B), an entire lower surface of the base 1 which is remote from the plating base film 4 is covered with a resist film 5, and an upper surface of the base 1, i.e., the plating base film 4, is selectively covered with a resist film 5. The resist film 5 may comprise a dry film or a liquid resist. Then, leads 6 having a thickness of about 30 μm, for example, are formed on the upper surface of the base 1 by electroplating copper.

The resist film 5 deposited on the upper surface of the base 1 is of a pattern which is negative or opposite with respect to the pattern of the leads 6.

The leads 6 thus formed of a very fine pattern compared with a TAB lead frame for reasons described below.

Because the leads 6 are deposited on the plating base film 4 on the etching stop film 3, the leads 6 are supported on the rigid metal film 4 and can thus be of thin and dense film properties. Since the leads 6 are formed by selective electroplating, they are not subject to side etching as is the case with selective etching.

Since all the leads 6 can be given a potential required for electroplating through the etching stop film 3, the plating base film 4, and the substrate 2, the leads 6 can be produced in a fine pattern by a selective electroplating process without the need for a special circuit or wiring for applying an electroplating potential to the leads. This is one of the most excellent advantages of the method of manufacturing a lead frame according to the preset invention over the conventional method of manufacturing a TAB lead frame.

If it is necessary to plate the leads 6 for better inner or outer lead bonding capability, then the formation of the leads 6 is followed by their electroplating. In this case, the leads 6 can also be plated by a selective electroplating process without the need for a special circuit or wiring for applying an electroplating potential to the leads.

(C) Then, the resist film 5 is removed, and thereafter resist films 7 each in the form of a dry film are selectively deposited on the both surfaces of the base 1. Using the resist films 7 as masks, the both surfaces of the base 1 are etched to form holes 8 as sprocket holes or slit-like holes for preventing the leads 6 from being deformed and also to form a recess 9 in the lower surface of the substrate 2 at a region corresponding to a lead-forming region, thereby reducing the thickness of the substrate 2.

Figure 1C:
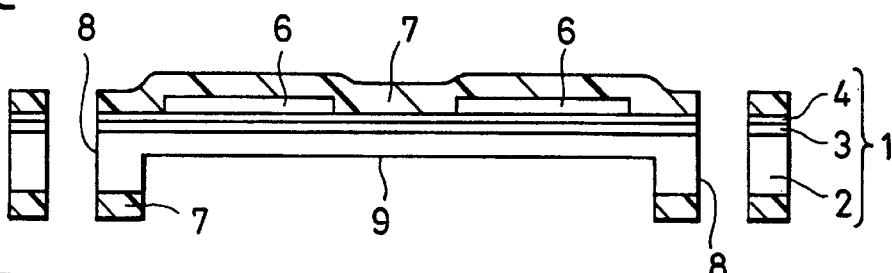

Therefore, the resist film 7 on the upper surface of the base 1 is of a pattern covering the upper surface except for the holes 8, and the resist film 7 on the lower surface of the base 1 is of a pattern covering the lower surface except for the holes 8 and the recess 9, i.e., the region corresponding to the lead-forming region. FIG. 1(C) shows the assembly after it is etched.

This etching process uses an etching solution of ferric chloride which can etch both copper and aluminum, and the thickness which is etched away has to be about half the thickness of the base 1 so that the holes 8 are formed as through holes.

Figure 1D:
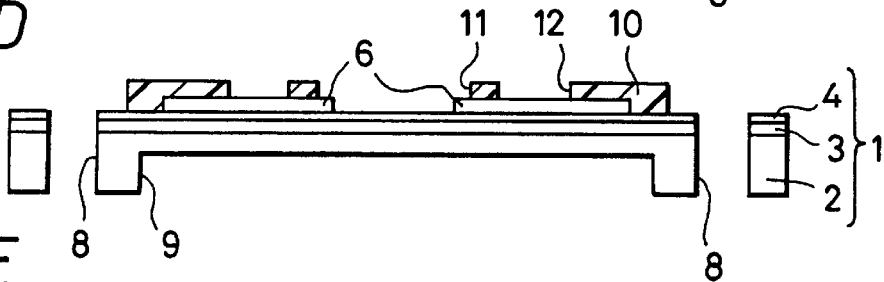

(D) Then, as shown in FIG. 1(D), the resist films 7 are removed, and a lead holder film 10 made of polyimide, for example, is applied to the region of the base 1 where the leads 3. The lead holder film 10 has a device hole 11 and an outer lead bonding slit 12 positioned outside of the device hole 11. When the assembly with the lead holder film 10 is viewed from above, inner leads 6i (see FIG. 1(E)) of the leads 6 extend into the device hole 11, whereas outer leads 6o (see FIG. 1(E)) of the leads 6 extend across the outer bonding slit 12.

The lead holder film 10 serves to hold the leads 6 positioned with respect to each other even after unwanted lead frame portions are removed and the leads 6 are electrically independent of each other. The lead holder film 10 corresponds to a carrier tape in TAB.

Figure 1E:
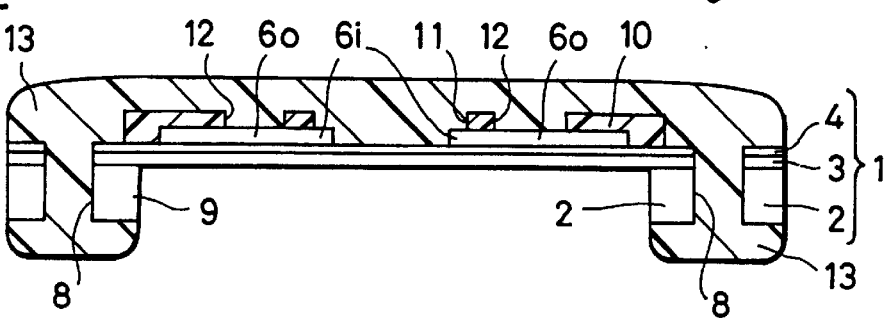
Figure 1F:
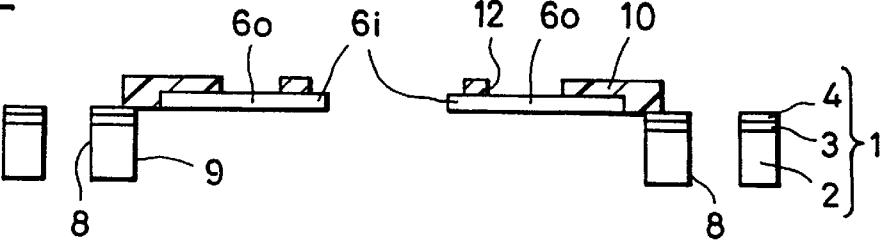

(E) Then, as shown in FIG. 1(E), the upper surface of the base 1 is entirely covered with a resist film 13, and the lower surface of the base 1 is selectively covered with a resist film 13. The region of the substrate 2 which corresponds to the lead-forming region, i.e., the recess 9, is etched to remove the entire substrate 2 of copper off the lower surface of the etching stop film 3 below the lead-forming region, thereby exposing the lower surface of the etching stop film 3. The substrate 2 of copper is etched away from the lower surface of the etching stop film 3 in order to be able to subsequently etch away the etching stop film 3 for eliminating the electric connection between the leads 6 through the etching stop film 3.

This etching process uses an etching solution comprising an aqueous solution of a mixture of hydrogen peroxide and sulfuric acid, for example, 8% of hydrogen peroxide and 10% of sulfuric acid, for allowing the etching stop film 3 of aluminum to function as an etching stopper to protect the leads 3 from the etching process.

(F) Thereafter, an etching solution for etching aluminum is used to remove the etching stop film 3 of aluminum, and then an etching solution of etching copper is used to remove the plating base film 4 of copper.

The leads 6 are now electrically independent of each other and held by the lead holder film 10, whereupon a lead frame is completed.

According to the above method of manufacturing a lead frame, the leads 6 can be formed in a fine pattern, and can be electroplated with utmost ease.

Since the holes 8 such as sprocket holes or slit-like holes for preventing the leads 6 from being deformed can be defined by selective etching on the both surfaces of the base 1, the lead frame can efficiently be manufactured as is the case with ordinary TAB tapes. While the lead holder film 10 is made of an expensive synthetic resin such as polyimide, it is prepared beforehand in a pattern which will finally be required and then applied to the base 1. Therefore, the applied lead holder film 10 is not wastefully removed at a later time, and hence the expensive material is not wasted. As a result, the cost of the produced lead frame may be lowered. The substrate 2 serves as a frame which is required to support the other elements during the process of manufacturing the lead frame.

Since the method of manufacturing a lead frame according to the present invention does not rely on the tool-to-tool tape carrier system, the method is suitable for a production scheme for producing many types in small quantities, which has recently been considered to be more important than before in the art. In this method, the sizes, particularly widths, of lead frames and circuit patterns are not limited by production equipment standards. Accordingly, the method can flexibly meet a variety of needs which will be growing in the art.

As described above, the outer lead bonding slit 12 is defined in the lead holder film 10 outside of the device hole 11. The inner leads 6i are bonded to electrodes on a semiconductor chip through the device hole 11 by a bonding tool which is introduced through the device hole 11 and pressed against the inner leads 6i. The outer leads 6o are bonded to a wiring pattern on a printed wiring board through the outer lead bonding slit 12 by bonding tools which are introduced through the device hole 11 and pressed against the outer leads 6o. After the outer leads 6o are bonded, outer portions of the bonded outer leads 6o and an outer peripheral edge of the lead holder film 10 are cut off. However, since the outer peripheral edge of the lead holder film 10 which is cut off are extremely small, no substantial material loss of polyimide is caused. Details of the bonding process will be described below.

Figure 2A:
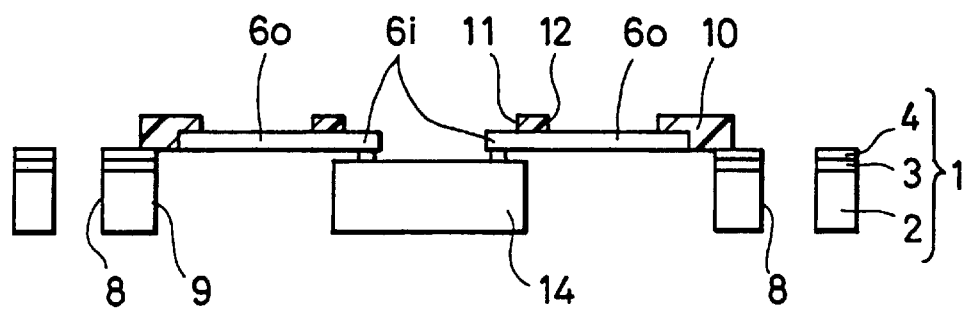
FIGS. 2(A) through 2(C) are cross-sectional views showing successive steps of a process of installing a lead frame manufactured according to the method shown in FIGS. 1(A) through 1(F).
Figure 2B:
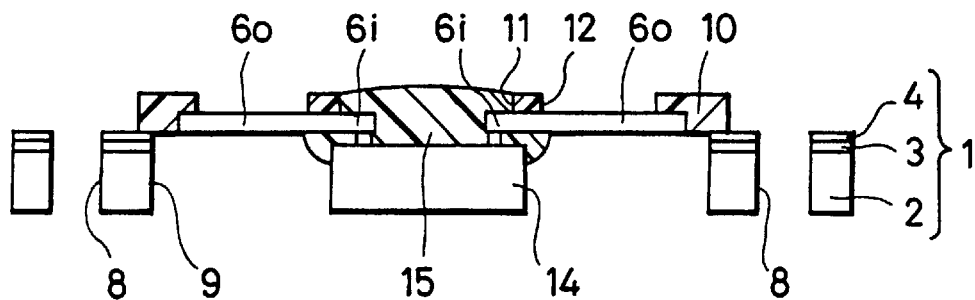
Figure 2C:
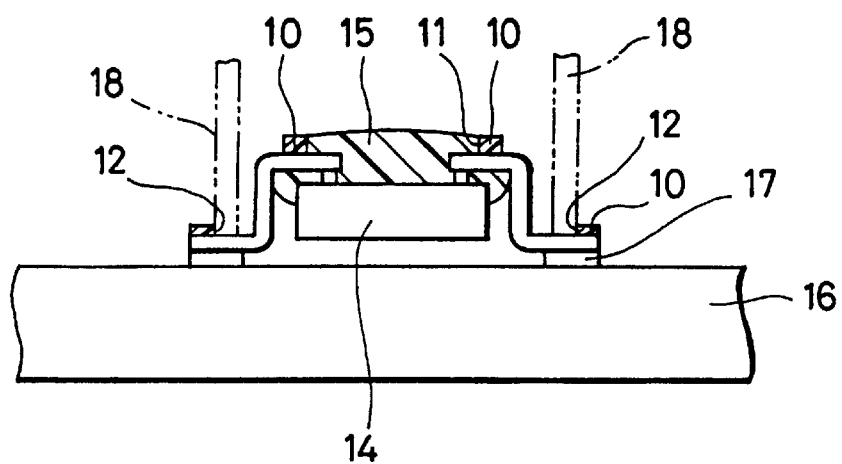

FIGS. 2(A) through 2(C) show successive steps (A) through (C) of a process of installing the lead frame which has been manufactured according to the steps shown in FIGS. 1(A) through 1(F).

(A) AS shown in FIG. 2(A), the inner leads 6i are bonded to electrodes on a semiconductor chip 14 by a bonding tool which is introduced through the device hole 11 and pressed against the inner leads 6i and pressed to press the inner leads 6i against the electrodes on the semiconductor chip 14.

(B) Then, as shown in FIG. 2(B), the inner leads 6i and electrodes which are bonded to each other are encapsulated or potted by a synthetic resin material 15.

(C) Thereafter, as shown in FIG. 2(C), the outer leads 6o are bonded to a wiring pattern 17 on a printed wiring board 16. Then, outer portions of the outer leads 6o and an outer peripheral edge of the lead holder film 10 are cut off. FIG. 2(C) shows the assembly after those portions of the outer leads 6o and the lead holder film 10 have been cut off.

The outer leads 6o are bonded to the wiring pattern 17 by bonding tools 18 which are introduced through the outer lead bonding slit 12 and pressed against the outer leads 6o to press the outer leads 6o against the wiring pattern 17.

Until the outer portions of the outer leads 6o and the outer peripheral edge of the lead holder film 10 are cut off, the remaining portions of the etching stop film 2 serve as a support frame for the lead frame. After the outer portions of the outer leads 6o and the outer peripheral edge of the lead holder film 10 are cut off, the remaining portions of the etching stop film 2 are removed. Though the outer peripheral edge of the lead holder film 10 is cut off, the quantity of the cut-off material very small, and hence substantial loss of the expensive polyimide is caused.

Having described a preferred embodiment of the invention with reference to the accompanying drawings, it is to be understood that the invention is not limited to that precise embodiment and that various changes and modifications could be effected by one skilled in the art without departing from the spirit or scope of the invention as defined in the appended claims.

What is claimed is:

1. A method of manufacturing a lead frame, comprising the steps of in the order set forth:

providing a base metal having a first surface coated with an etching stop film and a second surface, the etching stop film being coated with a plating base film, the plating base film having an upper surface;

forming a first resist film selectively on said upper surface of said plating base film selectively leaving uncoated portions of said upper surface as lead-forming regions for accommodating leads on said uncoated portions of said plating base film;

forming a second resist film on said second surface of said base metal;

electroplating a plurality of leads in said lead-forming regions of said upper surface of said plating base film by applying a potential through said plating base film, said etching stop film and said base metal;

removing the first and second resist films;

forming a first etching mask film in covering relation to said lead-forming regions while exposing portions where holes are to be defined, and a second etching mask in covering relation to said second surface while exposing a region of the second surface corresponding to said lead-forming region and portions where holes are to be defined;

etching said base metal through said first etching mask film and said second etching mask film to define said holes and to thin the region of the second surface corresponding to said lead-forming region;

applying a lead holder film of an insulating material to said first surface while exposing inner leads of said leads, said lead holder film having a device hole and an outer lead bonding slit positioned outside of said device hole; and selectively removing said second surface and said etching stop film for making the leads held by said lead holder film electrically independent of each other.

2. The method according to claim 1, wherein said plating base film is made of copper.

3. The method according to claim 1, further comprising the step of:

exposing said second surface in a region corresponding to said lead-forming region before said second surface and said etching stop film are selectively removed.

4. The method according to claim 1, wherein said etching stop film is made of aluminum.

5. A method of manufacturing a semiconductor package, comprising the steps of:

providing a base metal having a first surface coated with an etching stop film and a second surface, the etching stop film being coated with a plating base film, said plating base film having an upper surface;

forming a first resist film selectively on said upper surface of said plating base film selectively leaving uncoated portions of said upper surface as lead-forming regions for accommodating leads on said uncoated portions of said plating base film;

forming a second resist film on said second surface of said base metal;

electroplating a plurality of leads in said lead-forming regions of said upper surface of said plating base film by applying a potential through said plating base film, said etching stop film and said base metal;

removing the first and second resist films;

forming a first etching mask film in covering relation to said lead-forming region while exposing portions where holes are to be defined, and a second etching mask in covering relation to said second surface while exposing a region of the second surface corresponding to said lead-forming region and portions where holes are to be defined;

etching said base metal through said first etching mask film and said second etching mask film to define said holes and to thin the region of the second surface corresponding to said lead-forming region;

applying a lead holder film of an insulating material to said first surface while exposing inner leads of said leads, said lead holder film having a device hole and an outer lead bonding slit positioned outside of said device hole;

selectively removing said second surface and said etching stop film for making the leads held by said lead holder film electrically independent of each other;

bonding the inner leads of said leads to electrodes on a semiconductor chip;

encapsulating the bonded inner leads and a surface of the semiconductor chip which is bonded thereto with a resin material;

bonding outer leads of said leads to a wiring pattern on a printed wiring board;

removing outer portions of the bonded outer leads; and removing said etching stop film.

6. The method according to claim 5, wherein said plating base film is made of copper.

7. The method according to claim 7, further comprising the step of:

exposing said second surface in a region corresponding to said lead-forming region before said second surface and said etching stop film are selectively removed.

8. The method according to claim 5, wherein said etching stop film is made of aluminum.

* * * * *